(12) United States Patent  (10) Patent No.: US 8,659,073 B2
Kitajima  (45) Date of Patent: Feb. 25, 2014

(54) SEMICONDUCTOR DEVICE

(75) Inventor: Yuichiro Kitajima, Chiba (JP)

(73) Assignee: Seiko Instruments Inc., Chiba (JP)

( * ) Notice: Subject to any disclaimer, the term of this patent is extended or adjusted under 35 U.S.C. 154(b) by 23 days.

(21) Appl. No.: 13/529,628

(22) Filed: Jun. 21, 2012

(65) Prior Publication Data

US 2012/0256251 A1    Oct. 11, 2012

Related U.S. Application Data

(62) Division of application No. 12/539,910, filed on Aug. 12, 2009, now Pat. No. 8,227,856.

(30) Foreign Application Priority Data

Aug. 13, 2008 (JP) ................................. 2008-208582

(51) Int. Cl.
    H01L 29/66    (2006.01)
(52) U.S. Cl.
    USPC ..... 257/328; 257/339; 257/343; 257/E29.256
(58) Field of Classification Search
    USPC ............................ 257/328, 339, 343, E29.256
    See application file for complete search history.

(56) References Cited

U.S. PATENT DOCUMENTS

2006/0051933 A1    3/2006    Pendharkar
2007/0205466 A1    9/2007    Ebihara et al.

FOREIGN PATENT DOCUMENTS

JP    2007-214267    8/2007

Primary Examiner — Tan N Tran
(74) Attorney, Agent, or Firm — Brinks Gilson & Lione

(57) ABSTRACT

An ESD protection element is disclosed in which LOCOS oxide films are formed at both ends of a gate electrode, and a conductivity type of a diffusion layer formed below one of the LOCOS oxide films which is not located on a drain side is set to a p-type, to thereby limit an amount of a current flowing in a portion below a source-side n-type high concentration diffusion layer, the current being generated due to surface breakdown of a drain. With this structure, even in a case of protecting a high withstanding voltage element, it is possible to maintain an off-state during a steady state, while operating, upon application of a surge or noise to a semiconductor device, so as not to reach a breakage of an internal element, discharging a generated large current, and then returning to the off-state again.

8 Claims, 7 Drawing Sheets

Prior Art

SEMICONDUCTOR DEVICE

RELATED APPLICATIONS

This application is a divisional of U.S. patent application Ser. No. 12/539,910, filed Aug. 12, 2009, now U.S. Pat. No. 8,227,856 which claims priority under 35 U.S.C. §119 to Japanese Patent Application No. JP2008-208582 filed on Aug. 13, 2008, the entire content of each of which is hereby incorporated by reference.

BACKGROUND OF THE INVENTION

1. Field of the Invention

The present invention relates to an electrostatic discharge protection element for protecting a semiconductor device having a high withstanding voltage from breakdown due to a surge or noise represented by electrostatic discharge or the like.

2. Description of the Related Arts

A semiconductor device is equipped with an electrostatic discharge (hereinafter, briefly referred to as ESD) protection element for protecting internal elements from various surges or noises represented by ESD. Examples of the ESD protection element include a diode element, which is parasitically formed, a bipolar element, and a thyristor element. A function required to those elements is to hold constantly an off-state during a steady state, to operate before occurrence of a breakage of an internal element upon application of a surge or noise to a semiconductor device, to discharge a large current generated by the surge or noise, and to return to the off-state again.

As a general ESD protection element, an NMOS off transistor is exemplified. FIG. 6 illustrates a conventional NMOS off transistor. The NMOS off transistor of FIG. 6 is formed on a p-type semiconductor substrate 11, and includes a gate electrode 33 on a gate insulating film 22 formed on the p-type semiconductor substrate 11. An n-type high concentration diffusion layer 15a is formed on a drain electrode 31. An n-type high concentration diffusion layer 15b to serve as a source and a p-type high concentration diffusion layer 16 to take a potential of the p-type semiconductor substrate 11 are formed for a source-substrate substrate electrode 32. The n-type high concentration diffusion layer 15b, the p-type high concentration diffusion layer 16, and the gate electrode 33 are electrically connected to one another, and connected to a potential Vss. The drain electrode 31 is connected to a power supply terminal Vdd or an input/output terminal.

The NMOS off transistor of FIG. 6 has the following structure. When a negative polarity surge or noise is applied to the drain electrode 31, a forward bias is generated in a pn junction of the n-type high concentration diffusion layer 15a and the p-type semiconductor substrate 11, whereby charges are escaped to the Vss. When a positive polarity surge or noise is applied to the drain electrode 31, a generated reverse bias causes surface breakdown, and the source, the substrate, and the drain parasitically form an npn bipolar transistor, which is operated by a current flowing in the p-type semiconductor substrate 11, whereby a large current is escaped to the Vss. In order to reliably turn off the NMOS off transistor after the discharge of the surge or noise, it is important in the operation of the parasitic npn bipolar transistor to set a holding voltage to a value equal to or larger than a maximum operating voltage applied to the semiconductor device. According to a conventional structure, the holding voltage may be set with ease by adjusting an L length of the NMOS transistor. JP 2007-214267 A is described below as an example of such a structure.

In a case where the withstanding voltage of a semiconductor device to be protected is high, a high voltage is naturally required for a surface breakdown voltage and a holding voltage of an NMOS transistor. FIG. 7 illustrates an NMOS off transistor in which a drain electrode has a high withstanding voltage structure. The NMOS off transistor of FIG. 7 is formed on a p-type semiconductor substrate 11, and includes a gate electrode 33 on a gate insulating film 22 formed on the p-type semiconductor substrate 11. The NMOS off transistor of FIG. 7 has a LOCOS offset structure in which LOCOS oxide films 21a and 21b and n-type channel stop diffusion layers 13a and 13b are formed at both ends of the gate electrode 33. An n-type high concentration diffusion layer 15a and an n-type well diffusion layer 12 are formed on the drain electrode 31. The n-type well diffusion layer 12 is formed in order to mitigate electric field concentration, which is generated in a lower region of the n-type high concentration diffusion layer 15a when a high voltage is applied to the drain electrode 31. An n-type high concentration diffusion layer 15b to serve as a source and a p-type high concentration diffusion layer 16 to take a potential of the p-type semiconductor substrate 11 are formed for a source-substrate electrode 32. The n-type high concentration diffusion layer 15b, the p-type high concentration diffusion layer 16, and the gate electrode 33 are electrically connected to one another, and connected to a potential Vss. The drain electrode 31 is connected to a power supply terminal Vdd or an input/output terminal.

It is necessary to increase a junction withstanding voltage with the semiconductor substrate and a surface breakdown voltage with respect to the drain electrode, and hence an impurity concentration of the semiconductor substrate cannot be set to be excessively high. As the required withstanding voltage becomes higher, the concentration of the semiconductor substrate becomes lower. In FIG. 7, the NMOS off transistor is a high withstanding voltage protection element, and hence the concentration of the p-type semiconductor substrate 11 is extremely low. That is, the p-type semiconductor substrate 11 has a high resistance. Accordingly, when a positive polarity surge or noise is applied to the drain electrode 31, a current generated due to surface breakdown easily causes an increase in potential of the p-type semiconductor substrate 11 located below the n-type high concentration diffusion layer 15b and an n-type channel stop diffusion layer 13b, which easily sets an parasitic npn bipolar transistor into operation. As a result, there arises a problem that the holding voltage becomes extremely low.

As in the conventional structure, when the holding voltage is adjusted based on the L length of the NMOS transistor, a size of the NMOS off transistor increases. There may be conceived a method of enhancing the drain withstanding voltage by adjusting the thickness of the gate insulating film 22 and the concentration of the n-type diffusion layer of the drain electrode, to thereby increase the concentration of the p-type semiconductor substrate 11. However, according to the method, the structure of those components is greatly different from that of an internal element, which increases manufacturing steps. Further, the semiconductor device to be protected has a high withstanding voltage, and hence a difference between the maximum operating voltage and the holding voltage is increased when the holding voltage becomes extremely low. Accordingly, even with the use of the above-mentioned method, it is difficult to set the holding voltage equal to or larger than the maximum operating voltage.

SUMMARY OF THE INVENTION

In order to solve the above-mentioned problems, the present invention provides:

(1) a semiconductor device as an electrostatic discharge protection element in which: a gate insulating film is formed on a p-type semiconductor substrate or on a p-type well diffusion layer; a gate electrode is formed on the gate insulating film; LOCOS oxide films are formed at both ends of the gate electrode; a p-type channel stop diffusion layer is formed below one of the LOCOS oxide films; an n-type high concentration diffusion layer is formed so as to be adjacent to the p-type channel stop diffusion layer; a p-type high concentration diffusion layer is formed so as to be adjacent to the p-type channel stop diffusion layer and to the n-type high concentration diffusion layer; an n-type channel stop diffusion layer is formed below another one of the LOCOS oxide films; and another n-type high concentration diffusion layer is formed so as to be adjacent to the n-type channel stop diffusion layer; and (2) a semiconductor device as an electrostatic discharge protection element in which: a gate insulating film is formed on a p-type semiconductor substrate or on a p-type well diffusion layer; a gate electrode is formed on the gate insulating film; LOCOS oxide films are formed at both ends of the gate electrode; a p-type channel stop diffusion layer is formed below one of the LOCOS oxide films; a p-type high concentration diffusion layer is formed so as to be adjacent to the p-type channel stop diffusion layer; an n-type high concentration diffusion layer is formed so as to be surrounded by the p-type channel stop diffusion layer in a planar manner; an n-type channel stop diffusion layer is formed below another one of the LOCOS oxide films; and another n-type high concentration diffusion layer is formed so as to be adjacent to the n-type channel stop diffusion layer.

In the ESD protection element for protecting a semiconductor device having a high withstanding voltage from a noise or surge, the LOCOS oxide films are formed at both ends of the gate electrode, and a conductivity type of the diffusion layer formed below one of the LOCOS oxide films which is not located on a drain side is set to a p-type, to thereby limit an amount of a current, which is generated due to surface breakdown of a drain, flowing in a portion below a source-side n-type high concentration diffusion layer. Therefore, the holding voltage of an operation of a parasitic npn bipolar transistor can be increased, and characteristics of the ESD protection element can be easily set by using a diffusion layer or an insulating film necessary for an internal element, which eliminate the need to add a step of forming a diffusion layer or an insulating film exclusively to the ESD protection element. Further, even in a case of protecting a high withstanding voltage element, it is possible to easily satisfy a function required for the ESD protection element, the function of being constantly in an off-state during a steady state, while operating, upon application of a surge or noise to a semiconductor device, so as not to reach a breakage of an internal element, discharging a generated large current, and then returning to the off-state again.

DETAILED DESCRIPTION OF THE PREFERRED EMBODIMENTS

Hereinafter, preferred embodiments according to the present invention are described in detail with reference to the accompanying drawings.

Figure 1:
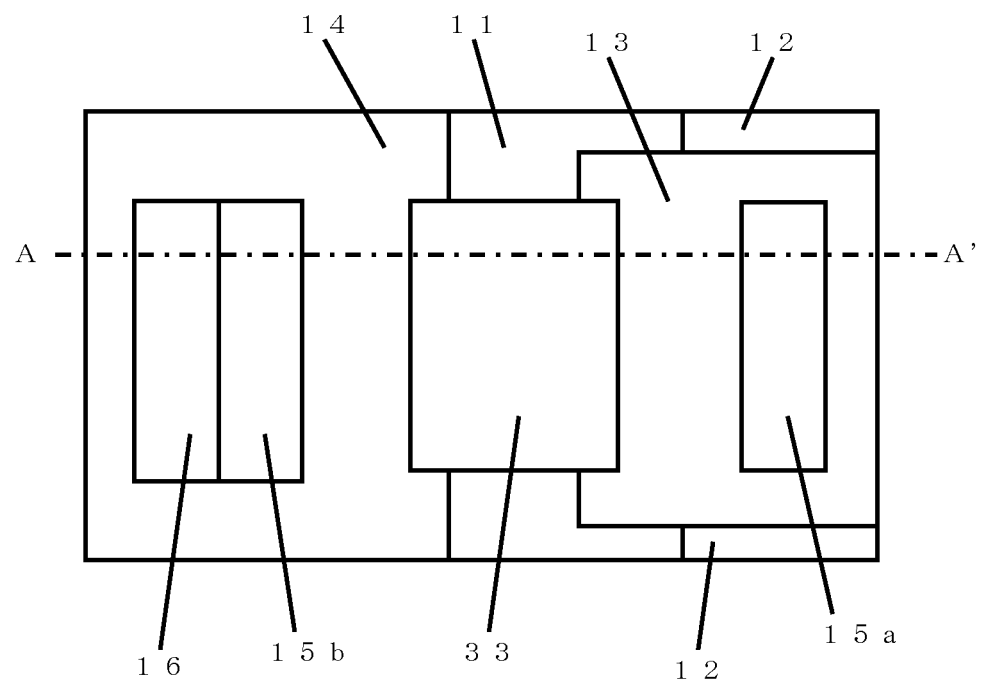
FIG. 1 is a schematic plan view illustrating a semiconductor device according to an embodiment of the present invention.

FIG. 1 is a plan view illustrating a semiconductor device according to a first embodiment of the present invention. A p-type high concentration diffusion layer 16 and an n-type high concentration diffusion layer 15b are formed adjacently to each other. A p-type channel stop diffusion layer 14 is formed so as to surround the p-type high concentration diffusion layer 16 and the n-type high concentration diffusion layer 15b in a planar manner. An n-type well diffusion layer 12 and an n-type channel stop diffusion layer 13 are formed so as to surround an n-type high concentration diffusion layer 15a. A part of a p-type semiconductor substrate 11 exists between the p-type channel stop diffusion layer 14 and the n-type channel stop diffusion layer 13. A gate electrode 33 is formed across the p-type semiconductor substrate 11, the p-type channel stop diffusion layer 14, and the n-type channel stop diffusion layer 13.

The structure of the semiconductor device is described below in more detail with reference to FIG. 2, which is a cross-sectional view taken along the chain line connecting A to A' of FIG. 1. The gate electrode 33 is formed on a gate insulating film 22 formed on the p-type semiconductor substrate 11. LOCOS oxide films 21a and 21b are formed at both ends of the gate electrode 33. The n-type high concentration diffusion layer 15a is formed for a drain electrode 31 so as to be adjacent to an n-type channel stop diffusion layer 13a, which is formed below the LOCOS oxide film 21a and serves as an offset layer for mitigating an electric field. The n-type well diffusion layer 12 is formed below the n-type high concentration diffusion layer 15a, and has a function of mitigating electric field concentration, which is generated in a lower region of the n-type high concentration diffusion layer 15a when a high voltage is applied to the drain electrode 31. The n-type high concentration diffusion layer 15b to serve as a source and the p-type high concentration diffusion layer 16 to take a potential of the p-type semiconductor substrate 11 are formed for a source-substrate electrode 32. A p-type channel stop diffusion layer 14b is formed adjacently to the n-type high concentration diffusion layer 15b below the LOCOS oxide film 21b. The n-type high concentration diffusion layer 15b, the p-type high concentration diffusion layer 16, and the gate electrode 33 are electrically connected to one another, and connected to a potential Vss. The drain electrode 31 is connected to a power supply terminal Vdd.

In an element having the above-mentioned structure, when a negatively charged noise is applied to the power supply terminal Vdd, a pn junction forming between the drain electrode 31 and the p-type semiconductor substrate 11 has a forward bias to allow the noise to escape to the potential Vss, whereby an internal element is protected.

In the element having the above-mentioned structure, conversely, when a positively charged noise is applied to the power supply terminal Vdd, surface breakdown occurs first in the pn junction forming between the drain electrode 31 and the p-type semiconductor substrate 11, and a current starts to flow into the p-type semiconductor substrate 11. Then, the current flowing into the p-type semiconductor substrate 11 is absorbed by the p-type high concentration diffusion layer 16 and discharged to the potential Vss. In this case, the majority of the current flowing into the p-type semiconductor substrate 11 passes through the p-type channel stop diffusion layer 14b, which is low in resistance, to reach the p-type high concentration diffusion layer 16. Only the remaining small part of the current flowing into the p-type semiconductor substrate 11 passes through the p-type semiconductor substrate 11 to reach the p-type high concentration diffusion layer 16. The part of the current passing through the p-type semiconductor substrate 11 flows below the n-type high concentration diffusion layer 15b, and hence a potential of a portion of the p-type semiconductor substrate 11 below the n-type high concentration diffusion layer 15b is increased, whereby a parasitic npn bipolar transistor starts to operate in an npn junction formed by the n-type high concentration diffusion layer 15b, the p-type semiconductor substrate 11, and the drain electrode 31. Accordingly, the noise applied to the power supply terminal Vdd is escaped to the potential Vss, whereby an internal element can be protected.

A surface breakdown voltage on the drain electrode 31 side is determined by the thickness of the gate insulating film 22, the concentrations of the n-type channel stop diffusion layer 13a and the p-type semiconductor substrate 11, and the like. The drain structure according to the present invention is the same as a drain structure of a high withstanding voltage NMOS transistor included in the internal element to be protected. By adjusting the width of the n-type channel stop diffusion layer 13a illustrated in FIG. 2, the surface breakdown voltage can be easily set to a value lower than that of the internal element. By changing the width of the p-type channel stop diffusion layer 14 illustrated FIG. 2, the holding voltage may be easily set. When the width of the p-type channel stop diffusion layer 14b is changed, a ratio of the current which reaches the p-type high concentration diffusion layer 16 via the p-type channel stop diffusion layer 14 and the current which reaches the p-type high concentration diffusion layer 16 directly from the p-type semiconductor substrate 11 is changed. Accordingly, the current flowing in a portion of the p-type semiconductor substrate 11 below the n-type high concentration diffusion layer 15b is reduced, and an increase in potential of the p-type semiconductor substrate 11 is suppressed, with the result that the holding voltage of the operation of the parasitic npn bipolar transistor is increased. With this structure, even when the concentration of the p-type semiconductor substrate 11 is set to be low for a higher withstanding voltage of the internal element, the holding voltage of an ESD protection element can be easily increased.

Figure 3:
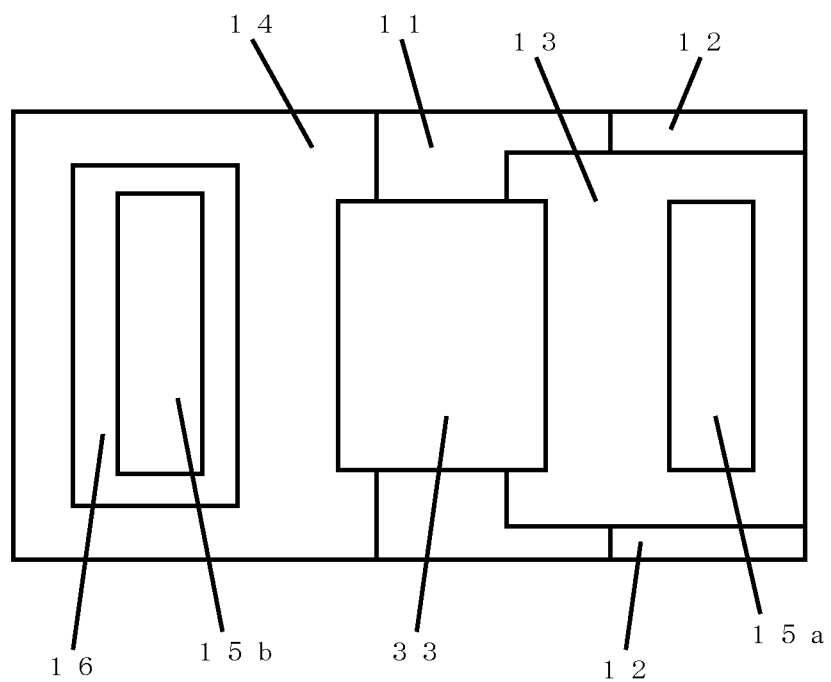
FIG. 3 is a schematic plan view illustrating the semiconductor device according to another embodiment of the present invention.
Figure 4:
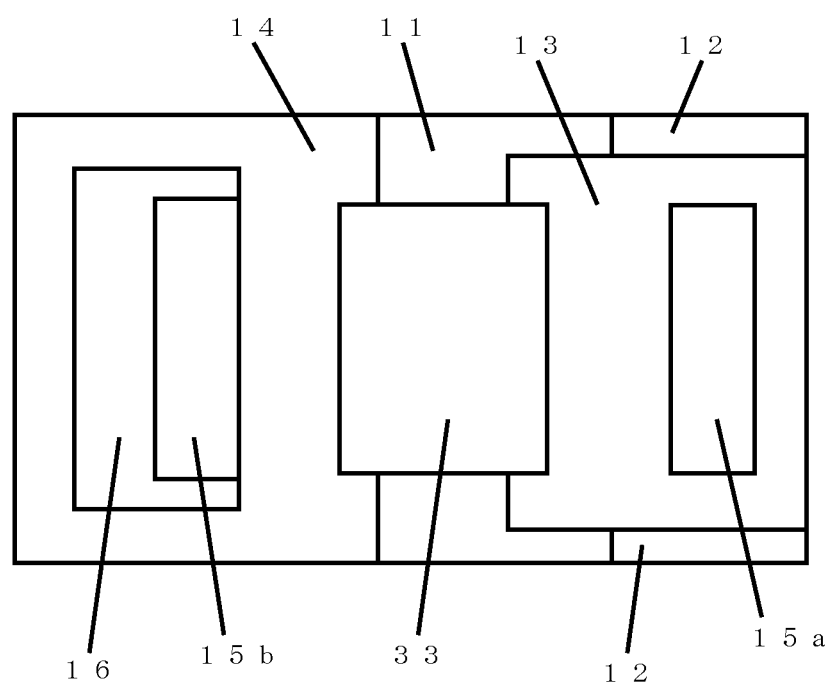
FIG. 4 is a schematic plan view illustrating the semiconductor device according to further another embodiment of the present invention.
Figure 5:
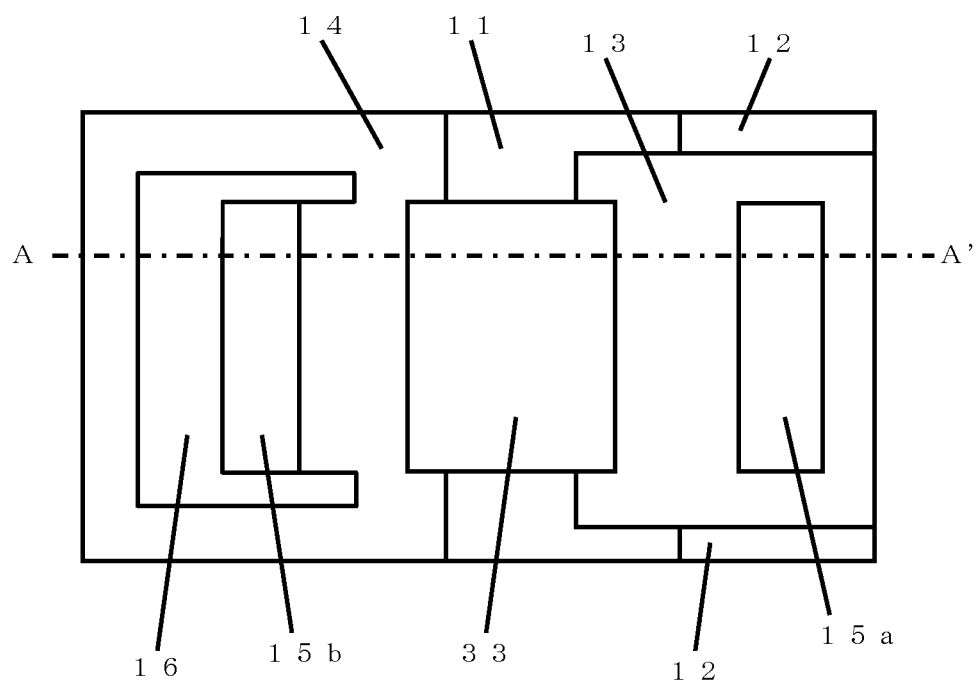
FIG. 5 is a schematic plan view illustrating the semiconductor device according to further another embodiment of the present invention.
Figure 6:
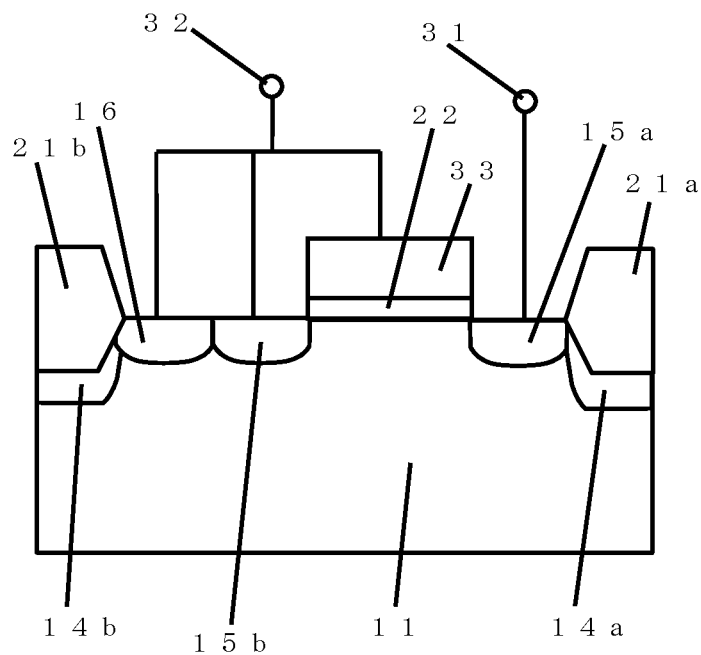
FIG. 6 is a schematic cross-sectional view illustrating a semiconductor device according to an embodiment of a conventional art.
Figure 7:
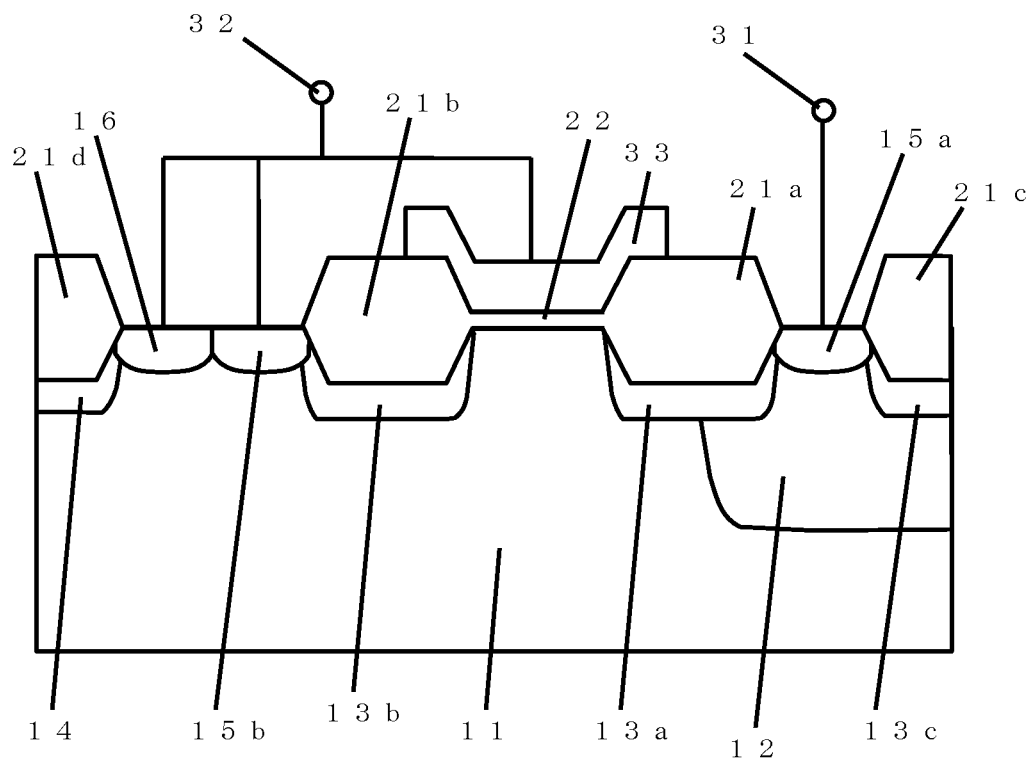
FIG. 7 is a schematic cross-sectional view illustrating a semiconductor device according to an embodiment of another conventional art.

The current flowing in the p-type semiconductor substrate 11 can be further limited by adopting, for example, a method as illustrated in FIG. 3 in which the n-type high concentration diffusion layer 15b is surrounded by the p-type high concentration diffusion layer 16. Alternatively, as illustrated in FIG. 4, a part of the n-type high concentration diffusion layer 15b is surrounded by the p-type high concentration diffusion layer 16 such that shorter side regions of the n-type high concentration diffusion layer 15b are also in contact with the p-type high concentration diffusion layer 16, or as illustrated in FIG. 5, a part of the n-type high concentration diffusion layer 15b is surrounded by the p-type high concentration diffusion layer 16 such that the shorter side regions of the n-type high concentration diffusion layer 15b are also in contact with the p-type high concentration diffusion layer 16, and in addition, the p-type high concentration diffusion layer 16 is extended out toward the gate electrode 33. In this manner, an increase in potential of the p-type diffusion layer adjacent to the shorter side regions of the n-type high concentration diffusion layer 15b is suppressed so that a parasitic npn bipolar transistor is prevented from operating around ends of the shorter side regions of the n-type high concentration diffusion layer 15b, whereby longer side regions of the n-type high concentration diffusion layer 15b can be effectively utilized.

As described above, the structure according to the present invention enables the following matters. There is no need to add a step of forming a diffusion layer or an insulating film exclusively to the ESD protection element. Characteristics of the ESD protection element may be easily set using a diffusion layer or an insulating film necessary for an internal element. Even in a case of protecting a high withstanding voltage element, the function required for the ESD protection element may be easily satisfied. That is, it is easy to satisfy a function of being constantly in an off-state during a steady state while operating, upon application of a surge or noise to a semiconductor device, so as not to reach a breakage of an internal element, discharging a generated large current, and then returning to the off-state again.

Figure 2:
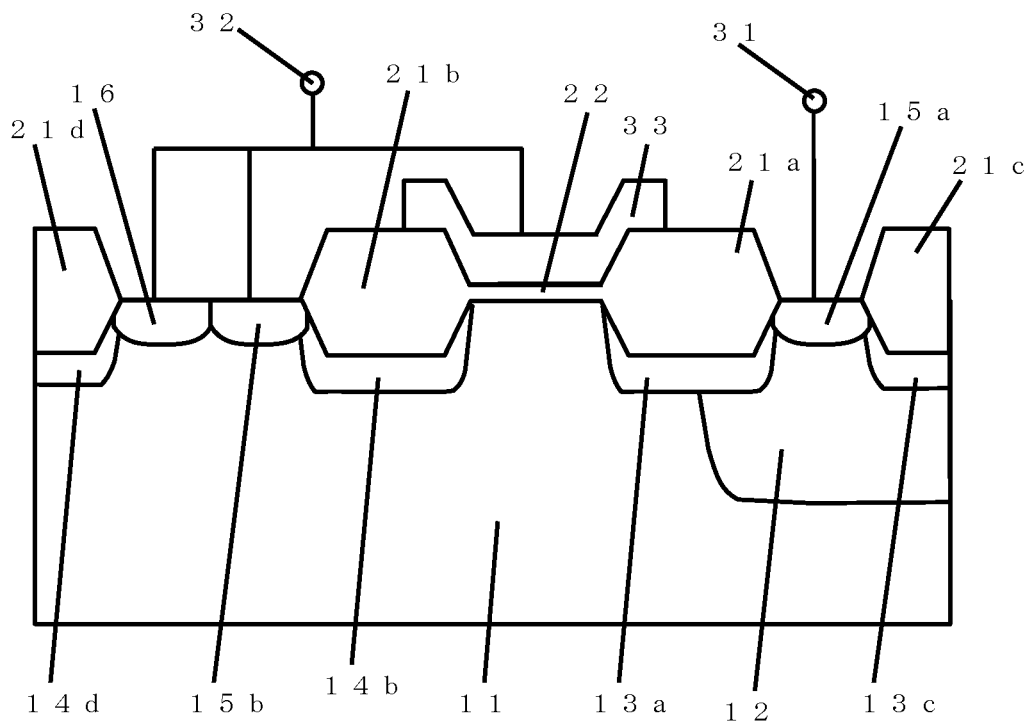
FIG. 2 is a schematic cross-sectional view illustrating the semiconductor device according to the embodiment of the present invention.

In the above-mentioned description, FIG. 2 illustrates an example in which the source-substrate electrode 32 is connected to the potential Vss, and the drain electrode 31 is connected to the power supply terminal Vdd. Alternatively, the source-substrate electrode 32 may be connected to the potential Vss, and the drain electrode 31 may be connected to the input/output terminal. Still alternatively, the source-substrate electrode 32 may be connected to the input/output terminal, and the drain electrode 31 may be connected to the power supply terminal Vdd. Basically, there may be adopted a connection method in which the drain electrode 31 is connected to a terminal applied with a potential higher than that of the source-substrate electrode 32 so as to ensure a path through which a noise or surge, which is applied to a certain terminal, can be escaped to the power supply terminal Vdd or the potential Vss.

In the present invention described above, there is exemplified a case where components are formed on a semiconductor substrate having a p-type conductivity. However, the same effect can be obtained even in a case where components are formed on a p-type well diffusion layer. For example, the same effect is obtained even in a case where components are formed in a p-type well diffusion layer formed on an n-type semiconductor substrate.

What is claimed is:
1. A semiconductor device, comprising:
  a gate insulating film formed on a surface of a p-type semiconductor region;
  a gate electrode disposed on the gate insulating film;
  LOCOS oxide films disposed on portions of the surface of the p-type semiconductor region, the portions being located at both ends of the gate electrode;
  a p-type channel stop diffusion layer disposed below one of the LOCOS oxide films;
  a p-type high concentration diffusion layer disposed on the p-type semiconductor region so as to contact the p-type channel stop diffusion layer;
  a first n-type high concentration diffusion layer disposed on the p-type semiconductor region so as to contact the p-type high concentration diffusion layer, wherein the first n-type high concentration diffusion layer is surrounded by the p-type high concentration diffusion layer in a planar manner;
an n-type channel stop diffusion layer disposed below another one of the LOCOS oxide films; and
a second n-type high concentration diffusion layer disposed to be in contact with the n-type channel stop diffusion layer.

2. The semiconductor device according to claim 1, further comprising an n-type well diffusion layer disposed around the second n-type high concentration diffusion layer adjacent to the n-type channel stop diffusion layer.

3. The semiconductor device according to claim 1, wherein the p-type high concentration diffusion layer, the first n-type high concentration diffusion layer, and the gate electrode are electrically connected to one another.

4. The semiconductor device according to claim 1, wherein:
the p-type high concentration diffusion layer, the first n-type high concentration diffusion layer, and the gate electrode are connected to a potential Vss; and
the second n-type high concentration diffusion layer is connected to a power supply terminal Vdd.

5. The semiconductor device according to claim 1, wherein:
the p-type high concentration diffusion layer, the first n-type high concentration diffusion layer, and the gate electrode are connected to a potential Vss; and
the second n-type high concentration diffusion layer is connected to an input/output terminal.

6. The semiconductor device according to claim 1, wherein:
the p-type high concentration diffusion layer, the first n-type high concentration diffusion layer, and the gate electrode are connected to an input/output terminal; and
the second n-type high concentration diffusion layer is connected to a power supply terminal Vdd.

7. The semiconductor device according to claim 1, wherein the first n-type high concentration diffusion layer is disposed in contact with the p-type channel stop diffusion layer, and
wherein the first n-type high concentration diffusion layer is disposed in contact with the p-type channel stop diffusion layer solely along one of relatively long sides of the first n-type high concentration diffusion layer, said one of the relatively long sides thereof being opposite to the gate electrode and surrounded partly by the p-type high concentration diffusion layer such that another of the relatively long sides and relatively short sides of the n-type high concentration diffusion layer are disposed in contact with the p-type high concentration diffusion layer.

8. The semiconductor device according to claim 7, wherein the p-type high concentration diffusion layer is extended towards the gate electrode over said one of the relatively long sides of the first n-type high concentration diffusion layer.

* * * * *